(12) United States Patent
Yamauchi et al.

(10) Patent No.: US 7,247,509 B2
(45) Date of Patent: Jul. 24, 2007

(54) METHOD FOR MANUFACTURING SOLID-STATE IMAGING DEVICES

(75) Inventors: Kouichi Yamauchi, Takatsuki (JP);
Masanori Minamio, Takatsuki (JP);
Katsutoshi Shimizu, Kyoto (JP);
Haruto Nagata, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 219 days.

(21) Appl. No.: 10/927,715

(22) Filed: Aug. 27, 2004

(65) Prior Publication Data

US 2005/0074912 A1 Apr. 7, 2005

(30) Foreign Application Priority Data

Sep. 3, 2003 (JP) ............................. 2003-311722

(51) Int. Cl.
*H01L 21/00* (2006.01)
(52) U.S. Cl. ............................ 438/33; 438/26; 438/29; 257/E33.058
(58) Field of Classification Search ................. 438/64, 438/66, 68, 125, 25, 26, 33, 29, 72
See application file for complete search history.

(56) References Cited

U.S. PATENT DOCUMENTS 5,064,782 A * 11/1991 Nishiguchi ................. 228/121
5,256,901 A * 10/1993 Ohashi et al. .............. 257/680

(Continued)

FOREIGN PATENT DOCUMENTS

JP 5-267629 10/1993

(Continued)

OTHER PUBLICATIONS

Lu Brian et al., "Active Pixel Sensor (APS) Package", 1999 International Conference on High Density Packaging and MCMs, XP000980682, pp. 175-178.

*Primary Examiner*—David A. Zarneke
(74) *Attorney, Agent, or Firm*—Hamre, Schumann, Mueller & Larson P.C.

(57) ABSTRACT

A solid-state imaging device is manufactured according to the steps below. A lattice-shaped rib forming member, which is an aggregation of a plurality of frame-shaped ribs for configuring a plurality of solid-state imaging devices, is resin-molded. An aggregate wiring board is used, which has regions corresponding to a plurality of the wiring boards, and in which a plurality of the wiring members are provided in each of the regions, and the imaging element is fastened to each region of the aggregate wiring board and the electrodes of the imaging elements and the wiring members are connected by a thin metal wire. The rib forming member is placed on the wiring board face and joined to the wiring board face, so that the imaging element is disposed inside the lattice elements of the rib forming member. The transparent plate is fastened to an upper face of the rib forming member, and each housing is cut in a direction perpendicular to the base portion, and in a direction dividing into two the width of the rib forming member, and separating the solid-state imaging devices into individual pieces It is possible to make a low cost housing, avoiding deformations caused by a difference in thermal expansion between the wiring board and the ribs made of a resin, when forming a plurality of housings together.

3 Claims, 4 Drawing Sheets

U.S. PATENT DOCUMENTS

| | | | |
|---|---|---|---|
| 5,436,492 A | 7/1995 | Yamanaka | |
| 5,729,437 A | 3/1998 | Hashimoto | |
| 5,811,799 A * | 9/1998 | Wu | 250/239 |
| 5,882,949 A | 3/1999 | Okazaki | |
| 5,905,301 A | 5/1999 | Ichikawa et al. | |
| 5,950,074 A * | 9/1999 | Glenn et al. | 438/121 |
| 5,977,627 A * | 11/1999 | Smolley | 257/709 |
| 5,998,862 A * | 12/1999 | Yamanaka | 257/704 |
| 6,057,597 A * | 5/2000 | Farnworth et al. | 257/710 |
| 6,060,340 A | 5/2000 | Chou | |
| 6,075,237 A | 6/2000 | Ciccarelli | |
| 6,130,448 A | 10/2000 | Bauer et al. | |
| 6,262,479 B1 * | 7/2001 | Chou | 257/704 |
| 6,268,231 B1 | 7/2001 | Wetzel | |
| 6,351,027 B1 * | 2/2002 | Giboney et al. | 257/684 |
| 6,383,835 B1 | 5/2002 | Hata et al. | |
| 6,590,269 B1 * | 7/2003 | Chuang et al. | 257/432 |
| 6,603,183 B1 | 8/2003 | Hoffman | |
| 6,660,557 B2 * | 12/2003 | Usami | 438/106 |
| 6,730,991 B1 | 5/2004 | Douglas | |
| 6,737,720 B2 * | 5/2004 | Ho et al. | 257/433 |
| 6,759,266 B1 * | 7/2004 | Hoffman | 438/64 |
| 6,767,753 B2 * | 7/2004 | Huang | 438/25 |
| 6,784,534 B1 * | 8/2004 | Glenn et al. | 257/704 |
| 6,803,251 B2 | 10/2004 | Kwon et al. | |
| 6,809,412 B1 * | 10/2004 | Tourino et al. | 257/678 |
| 6,890,834 B2 * | 5/2005 | Komobuchi et al. | 438/455 |
| 6,897,428 B2 * | 5/2005 | Minamio et al. | 250/208.1 |
| 6,900,531 B2 * | 5/2005 | Foong et al. | 257/687 |
| 6,929,974 B2 | 8/2005 | Ding et al. | |
| 6,982,470 B2 * | 1/2006 | Omori | 257/434 |
| 7,196,359 B2 | 3/2007 | Baur et al. | |
| 2001/0020738 A1 | 9/2001 | Iizima et al. | |
| 2002/0142510 A1 | 10/2002 | Adachi | |
| 2003/0193018 A1 * | 10/2003 | Tao et al. | 250/239 |
| 2004/0038442 A1 * | 2/2004 | Kinsman | 438/64 |

FOREIGN PATENT DOCUMENTS

| | | |
|---|---|---|
| JP | 2000-058805 | 2/2000 |
| JP | 2001-257334 | 9/2001 |
| JP | 2002-043554 | 2/2002 |
| JP | 2002-299595 | 10/2002 |
| JP | 2002-353354 | 12/2002 |
| JP | 2002-353763 | 12/2002 |
| JP | 2002-373950 | 12/2002 |
| JP | EP 1 376 705 | 6/2003 |
| JP | 2004-200583 | 7/2004 |
| KR | 2001-0064908 | 7/2001 |

* cited by examiner

METHOD FOR MANUFACTURING SOLID-STATE IMAGING DEVICES

FIELD OF THE INVENTION

The present invention relates to methods for manufacturing solid-state imaging devices in which imaging elements such as CCDs or the like are mounted within a housing.

BACKGROUND OF THE INVENTION

Solid state imaging devices, which are widely used for video cameras and still cameras and the like, are provided in the form of a package, in which an imaging element such as a CCD or the like is mounted on a base made of an insulating material, with the photodetecting region being covered by a transparent plate. In order to make the device more compact, the imaging element is mounted as a bare chip on the base. Referring to FIG. 7, the following is an explanation of the solid-state imaging device disclosed in JP H5-267629A as a conventional example of these types of solid-state imaging devices.

In FIG. 7, numeral 21 denotes a base, on the top face of which is formed a recess portion. An imaging element chip 22 is formed in the center of the recess portion. The base 21 is provided with a lead terminal 24, a lead side pad 25 of which is connected by a bonding wire 26 made of metal to a bonding pad 23 of the imaging element chip 22. A package is formed for the purpose of protecting the imaging element chip 22 by integrally forming a rib 28 on an upper surface of a peripheral portion of the base 21 and fastening a transparent sealing glass plate on top of it.

This type of solid-state imaging device is mounted on a circuit board with the sealing glass plate 27 facing upward, as shown in FIG. 7, and the lead terminals 24 are used to connect it to the electrodes on the circuit board. Although not shown in the drawings, a lens barrel incorporating an imaging optical system whose relative position to the photodetecting region formed in the imaging element chip 22 is adjusted with a predetermined precision is mounted on top of the sealing glass plate 27. During the imaging operation, object light that has passed through the imaging optical system incorporated in the lens barrel is focused on the photodetecting region and photoelectrically converted.

The above-described conventional example of a solid-state imaging device has a housing structure in which the rib 28 is formed on the upper surface of the peripheral portion of the base 21. The casting mold for molding the housing with resin is matched to the housing specification and must be made for each product, leading to an increase in the manufacturing cost.

For that reason, a process using a wiring board which can be manufactured more cheaply, and using a process of molding resin ribs onto the wiring board is conceivable. However, when molding resin ribs onto the wiring board, deformations of the housing such as warping and twisting tend to occur, caused by the difference in thermal expansion between the wiring board containing metal wires and the rib made of a resin. This problem is particularly conspicuous when manufacturing a plurality of housings for solid-state imaging devices all together.

Also, for the purpose of suppressing the scatter of light incident on the internal space of the housing, the ribs sometimes are provided with a taper. The taper direction differs according to the design of the solid-state imaging device. However when the taper direction is provided such that the rib width increases away from the board surface (called a "reverse taper" below), an impediment to rib resin molding develops. That is to say, if the housing structure is formed integrally with the rib 28 on the upper surface of the peripheral portion of the base 21, or if the rib is resin-molded onto the wiring board, mold release after molding of the portion of the forming die which forms the internal space of the housing becomes problematic because of the rib's reverse taper.

SUMMARY OF THE INVENTION

It is an object of the present invention to provide a method for manufacturing a solid-state imaging device, in which it is possible to make a low cost housing with minimal deformation, avoiding deformation of the housing caused by a difference in thermal expansion between a wiring board and a rib made of a resin during batch manufacture of the housing for the purpose of configuring a plurality of solid-state imaging devices.

It is another object of the present invention to provide a method for manufacturing a solid-state imaging device with which it is possible to provide a rib with a reverse taper by a simple process.

A method for manufacturing a solid-state imaging device according to an aspect of the present invention is for manufacturing a solid-state imaging device that comprises a wiring board made of an insulating resin, frame-shaped ribs forming an internal space, the frame-shaped ribs being disposed on top of the wiring board, a plurality of wiring members for electrically conducting to an external portion from the internal space of a housing formed of the wiring board and the ribs, an imaging element fastened to the wiring board inside the internal space, a transparent plate fastened to an upper surface of the ribs, and connecting members that connect electrodes of the imaging element with the wiring members.

To solve the above-state problems, the method for manufacturing a solid-state imaging device according to the present invention comprises resin molding a lattice-shaped rib forming member, which is an aggregation of a plurality of frame-shaped ribs for configuring a plurality of solid-state imaging devices; using an aggregate wiring board, which has regions corresponding to a plurality of the wiring boards, and in which a plurality of the wiring members are provided in each of the regions; fastening an imaging element to each region of the aggregate wiring board and connecting by the connecting members the electrodes of the imaging elements and the wiring members; placing the rib forming member on the wiring board face and joining it with the wiring board face, so that the imaging element is disposed inside the lattice elements of the rib forming member; fastening the transparent plate to an upper face of the rib forming member; and cutting each housing in a direction perpendicular to the base portion, and in a direction dividing into two the width of the rib forming member, and separating the solid-state imaging devices into individual pieces.

DESCRIPTION OF THE PREFERRED EMBODIMENTS

According to the method for manufacturing solid-state imaging devices in the present invention, a separate resin formed rib forming member is joined to a wiring board, thus avoiding deformation of the housing caused by a difference in thermal expansion between the wiring board and the resin ribs at the time of resin molding, and it is possible to manufacture a low cost housing with high accuracy.

Furthermore, because the rib forming member is independently resin molded, there is no obstruction to mold release after resin molding of the taper formed on the rib.

In the method for manufacturing solid-state imaging devices according to the present invention, it is possible that, when fastening the transparent plate, the transparent plate of a size covering the plurality of housings is fastened to the top face of the rib forming member, and when cutting each housing, the transparent plate also is cut at the same time. Alternatively, when fastening the transparent plate, a plurality of transparent plates corresponding to the individual housings are used, edges of adjacent transparent plates are mounted onto the rib forming member forming a gap between the edges, and the solid-state imaging devices are separated into pieces in a region of the gaps.

Moreover, the rib forming member may be resin molded so that a cross sectional shape of the ribs has a taper in a vertical direction, and the rib forming member may be fastened to a wiring board face such that a narrow side of the ribs faces the wiring board, making it easy to provide the rib with a reverse taper.

Figure 1:
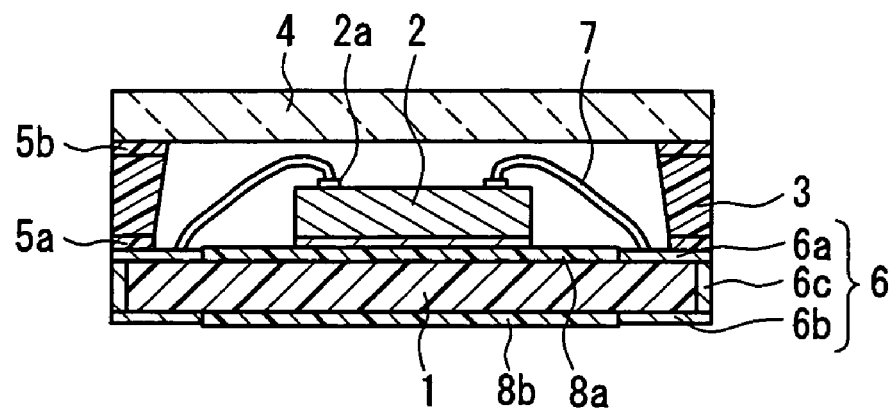
FIG. 1 is a cross-sectional view showing a configuration of a solid-state imaging device manufactured according to an embodiment of the present invention.
Figure 2:
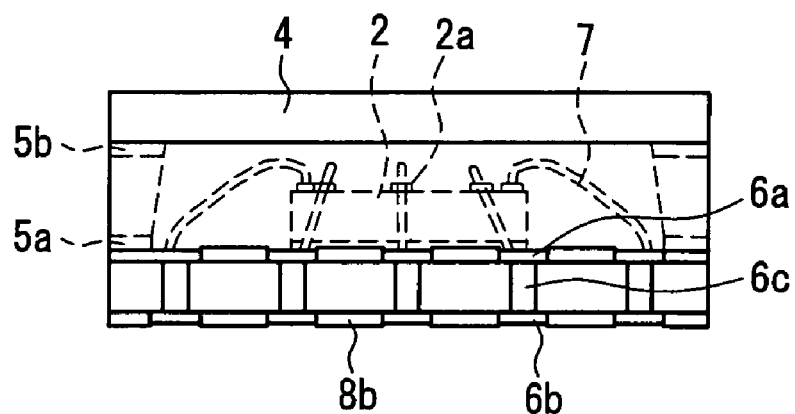
FIG. 2 is a lateral view of the solid-state imaging device of FIG. 1.
Figure 3:
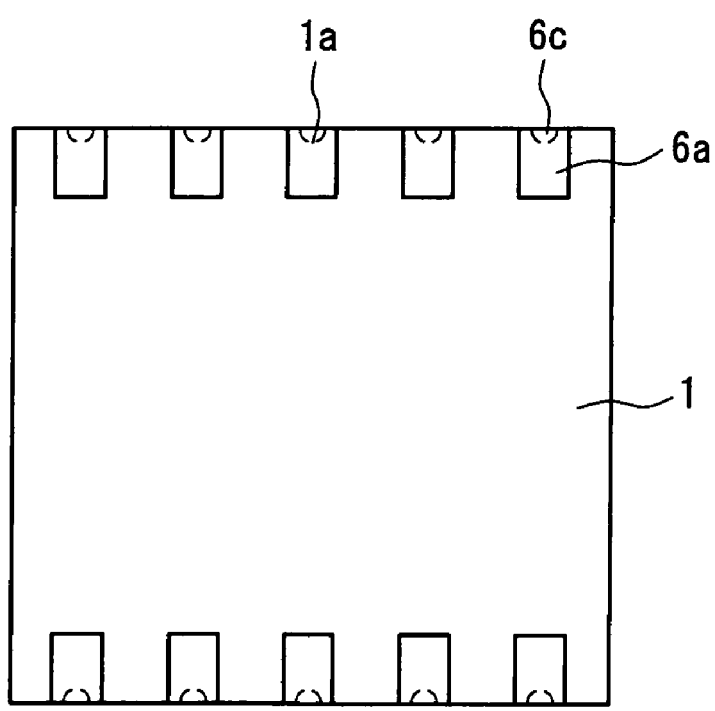
FIG. 3 is a bottom face view of the solid-state imaging device of FIG. 2.

A method for manufacturing a solid-state imaging device according to an embodiment of the present invention will be explained more specifically below with reference to the drawings. The structure of the solid-state imaging device manufactured by the present embodiment is explained first with reference to FIGS. 1 to 3. FIG. 1 is a cross-sectional view of the solid-state imaging device and FIG. 2 is a lateral view. FIG. 3 is a view of the bottom face of FIG. 2.

A wiring board 1 is flat and plate-shaped, and is composed of an insulating resin that ordinarily is used for wiring boards, such as for example a glass epoxy resin. An imaging element 2 is fastened to the top of the wiring board 1, and ribs 3 shaped like a rectangular frame when viewed from above are bonded onto the wiring board 1 with an adhesive 5a so as to surround that imaging element 2. The ribs 3 are composed of for example epoxy resin, and have for example a height of 0.3 to 1.0 mm. The internal surface of the ribs 3 is inclined so that the width of the ribs 3 enlarges with the distance from the wiring board 1. That is to say, a reverse taper is applied to the cross-sectional shape of the ribs 3 such that the internal space enclosed by the rib 3 narrows with distance away from the wiring board 1. It is preferable that the inclination angle of the ribs 3 is in a range of 2 to 12° with respect to a direction perpendicular to the surface of the wiring board 1.

A transparent plate 4 is fastened by an adhesive agent 5b on the upper surface of the ribs 3. A package containing an internal space is formed by the wiring board 1, the ribs 3 and the transparent plate 4. A plurality of wires 6 for electrically connecting the internal and external portions of the package is formed on the wiring board 1. Metal thin wires 7 connecting pad electrodes 2a of the imaging element 2 to the wires 6 are provided inside the package space. The thickness of the entire package is not more than 2.0 mm. It is also possible that the pad electrodes 2a of the imaging element are connected to the wires 6 by a method other than using the thin metal wire 7.

The wires 6 are made of an internal electrode 6a formed on the surface on which the imaging element 2 is mounted, an external electrode 6b formed on the rear face, and an end face electrode 6c formed on the end face of the wiring board 1. The external electrode 6b is positioned at a position corresponding to the internal electrode 6a. The end face electrode 6c connects the internal electrode 6a to the external electrode 6b. Any of the internal electrode 6a, the external electrode 6b and the end face electrode 6c can be formed for example by plating. The end face electrode 6c is positioned in a recess portion 1a formed in the end face of the wiring board 1, as shown in FIG. 3. The surface of the end face electrode 6c is formed substantially flush with the end face of the wiring board 1, or is indented more than the end face of the wiring board 1.

Insulating films 8a and 8b (the insulating film 8b is not shown in FIG. 3) are formed in the region surrounding the internal electrode 6a and the external electrode 6b on both surfaces of the wiring board 1. The surface of the external electrode 6b is formed as shown in the drawings, indented from the surface of the insulating film 8b, or substantially flush with the surface of the insulating film 8b. It is possible to position the insulating film 8b and the external electrode 6b such that they have no overlapping portions, or the perimeter portion of the external electrode 6b and the insulating film 8b can be positioned so they do overlap.

The end face of the wiring board 1, the lateral face of the ribs 3 and the end face of the transparent plate 4 that correspond to the lateral face of the package are formed substantially flush and consequently the package lateral face is flat. The package lateral face can be formed with a high degree of flatness by cutting, for example, the end face of the wiring board 1, the lateral face of the rib 3 and the end face of the transparent plate 4 at the same time in the manufacturing process.

According to the configuration above, the wiring board 1 is formed using a simple wiring board, and it is possible to form the wires 6 easily by plating across the range from the upper face of the wiring board 1 via the end face to the lower face. Thus, it is easy to make the package more compact.

Next, a manufacturing method according to the present embodiment, for manufacturing the solid-state imaging device described above, is explained with reference to FIGS. 4A to 4F and FIG. 5.

Figure 4A:
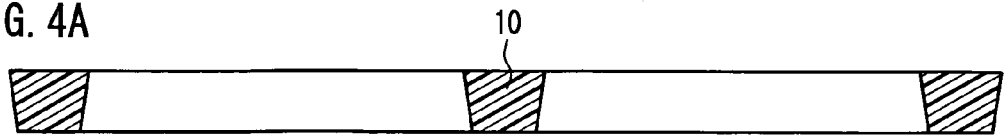
FIG. 4A to 4F are cross-sectional views showing a method for manufacturing the solid-state imaging device according to an embodiment of the present invention.
Figure 5:
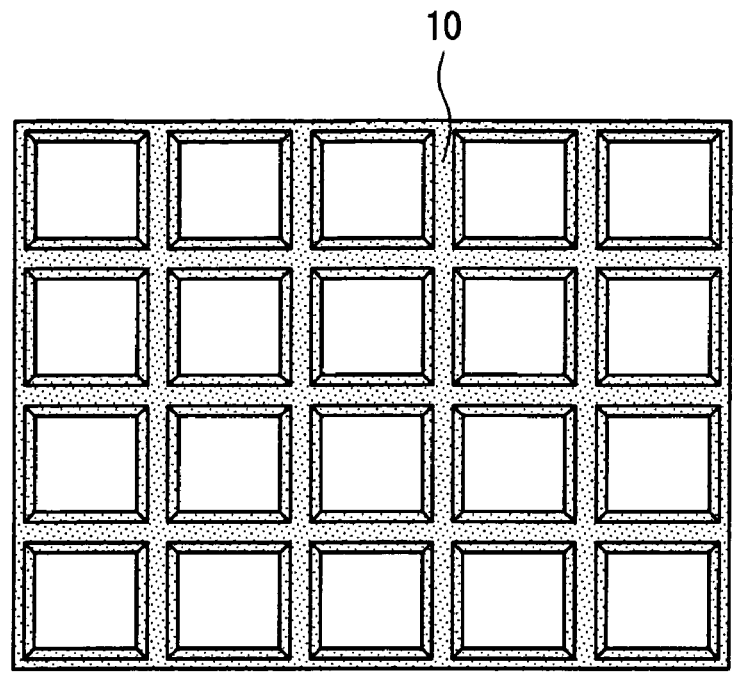
FIG. 5 is a top view showing the rib forming members in the same manufacturing method.

First, as shown in FIG. 4A, rib forming members 10 are molded from resin. The rib forming members 10 have the form of an aggregation of a plurality of frame-shaped ribs 3 (see FIG. 1) in order to configure a plurality of solid-state imaging devices. Their planar shape is that of a lattice as shown in FIG. 5. The rib forming members 10 are independently resin-molded using a metal die for example. Also, as shown in FIG. 4A, the cross sectional shape of each rib of the rib forming members 10 has a taper in the vertical direction.

Figure 4B:
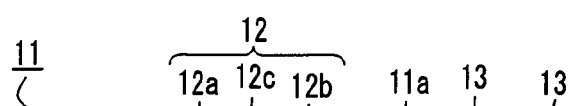

Furthermore, as shown in FIG. 4B, an aggregate wiring board 11 is prepared which has a region corresponding to a plurality of wiring boards 1 (see FIG. 1). The aggregate wiring board 11 is made by providing a flat plate-shaped base material 11a composed of an insulating resin with wiring members 12. The wiring members 12 form each of the plurality of wires 6 (see FIG. 1) in the regions corresponding to the wiring board 1. An insulating film 13 is formed on the upper and lower face of the base material 11a at the portions not covered by the wiring members 12.

The wiring members 12 include an upper face conducting layer 12a and a lower face conducting layer 12b formed respectively on the upper and lower faces of the base material 11a. The upper face conducting layer 12a and the lower face conducting layer 12b are positioned at corresponding positions in the vertical direction, and are connected by a through conducting layer 12c, which is formed by piercing the base material 11a. These conducting layers may be formed by any usual method. For example, forming through hole in the base material 11a, forming the through conducting layer 12c by plating, and matching to the position of the through conducting layer 12c, the upper face conducting layer 12a and the lower face conducting layer 12b can be formed by plating.

Figure 4C:
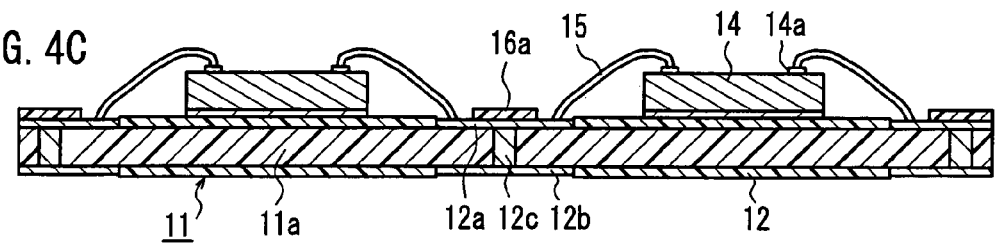

Next, as shown in FIG. 4C, an imaging element 14 is fastened inside each of the regions corresponding to a wiring board 1, and a pad electrode 14a of the imaging element 14 is connected to each upper face conducting layer 12a by a thin metal wire 15. An adhesive layer 16a is formed at the boundary of each region corresponding to the wiring board 1. The adhesive layer 16a is positioned so as to straddle across the upper face conducting layer 12a at the position of the through conducting layer 12c.

Figure 4D:
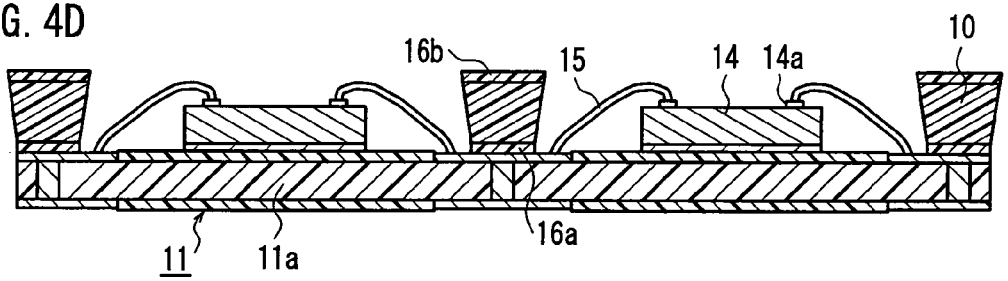

As shown in FIG. 4D, the rib forming members 10 are mounted above the adhesive layer 16a, and are joined on to the aggregate wiring board 11. By this, the imaging elements 14 are disposed inside the lattice elements. The rib forming members 10 form a condition such that the ribs 3 which configure the adjacent solid-state imaging devices are arranged in an integral combination, and separated in the process described below so as to each belong to one of the solid-state imaging devices. Furthermore, the rib forming members 10 are joined in a direction such that the narrow side of the rib 3 faces the aggregate wiring board 11. Still further, an adhesive layer 16b is formed on the upper face of the rib forming members 10.

Figure 4E:
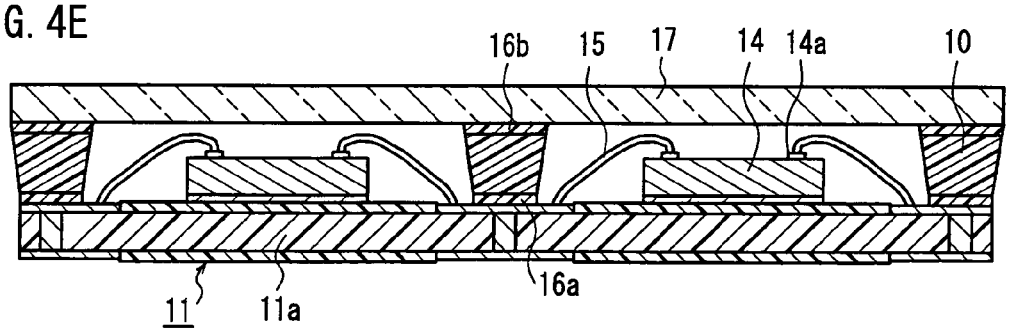

Next, as shown in FIG. 4E, a transparent plate 17 is mounted on the upper face of the rib forming members 10 via the adhesive layer 16b, and is joined by the adhesive layer 16b.

Figure 4F:
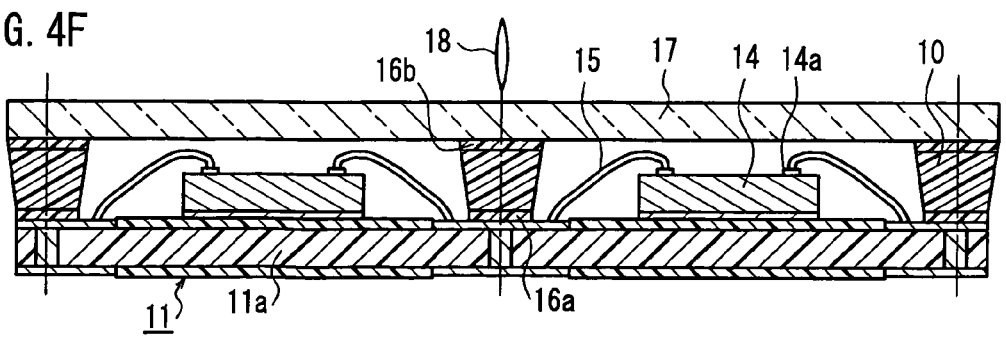

Next, as shown in FIG. 4F, the transparent plate 17, the rib forming members 10 and the aggregate wiring board 11 are cut by a dicing blade 18, and the pieces forming the solid-state imaging devices are separated. As shown in FIG. 4F, cutting is performed in a direction perpendicular to the aggregate wiring board 11, and in the direction that divides into two the width of each rib forming member 10 when viewed from above. The result is that the rib forming member 10, the upper face conducting layer 12a, the lower face conducting layer 12b and the through conducting layer 12c are halved, forming the ribs 3, the internal electrodes 6a, the external electrodes 6b and the end face electrodes 6c on each individual solid-state imaging device.

According to this manufacturing method, after resin molding independently the rib forming members 10, they are joined to the aggregate wiring board 11, so there is no deformation of the housing caused by a difference in thermal expansion between the aggregate wiring board 11 having metal wires, and the rib forming members 10 made of a resin before and after molding of the rib forming members 10.

Furthermore, according to this manufacturing method, the width of the ribs 3 is half that of the rib forming members 10, which is advantageous for miniaturization. Furthermore, by cutting the transparent plate 17, the rib forming members 10 and the aggregate wiring board 11 all together, the plane formed by the end face of the wiring board 1, the lateral face of the rib 3 and the end face of the transparent plate 4 is substantially flush, making it possible to obtain a high degree of smoothness.

It should be noted that the explanation above has used an example of the housing providing the ribs 3 with a reverse taper. However even if no reverse taper is provided to the ribs 3, it is similarly effective to join the wiring board after molding the rib forming members independently as in the present embodiment.

Figure 6:
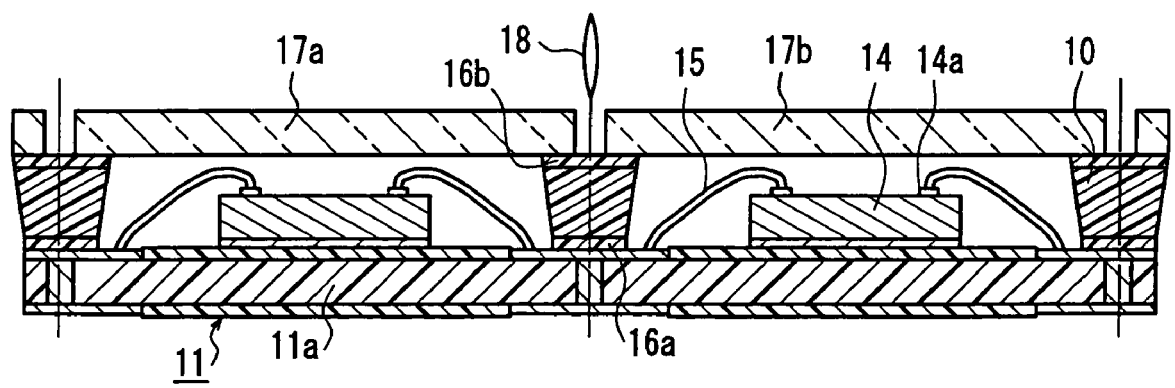
FIG. 6 is a cross-sectional view showing an example of a change to one portion of the process in the same manufacturing method.
Figure 7:
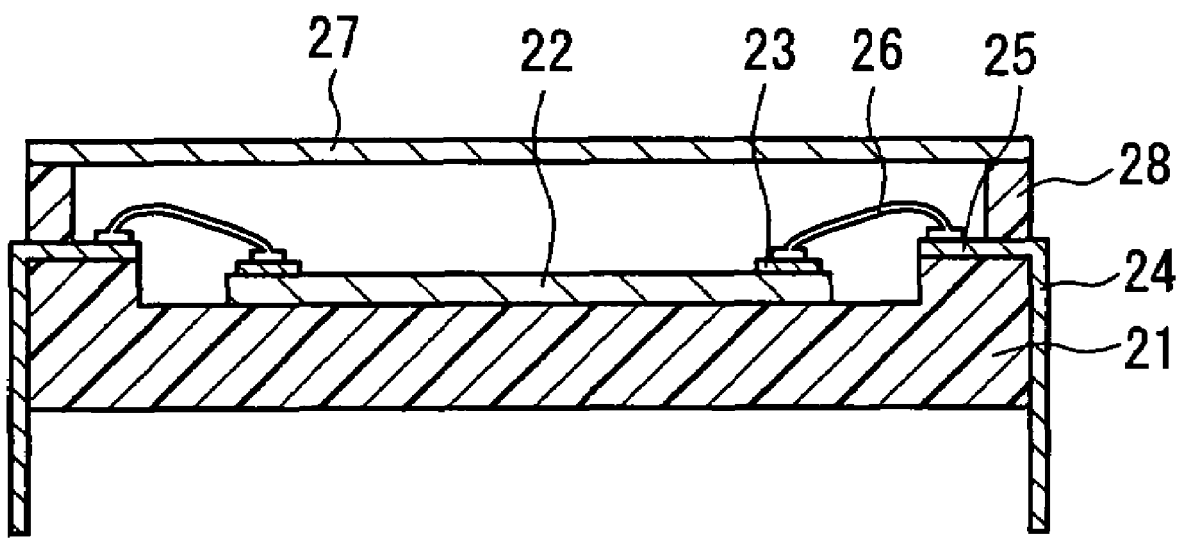
FIG. 7 is a cross-sectional view of an example of a conventional solid-state imaging device.

Furthermore, as described above, setting the transparent plate 17 to a size covering a plurality of housings, when cutting each housing, it is possible to employ the method shown in FIG. 6, and there is no limitation to the method of cutting the transparent plate 17 as well. The individual transparent plates 17a, 17b etc. also may be prepared for each of the housings, and the edges of adjacent transparent plates 17a, 17b may be mounted, with gaps between them, on the rib forming member 10. Each solid-state imaging device is separated into pieces in that region of gaps.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a solid-state imaging device which comprises a wiring board made of an insulating resin, frame-shaped ribs forming an internal space, the frame-shaped ribs being disposed on top of the wiring board, a plurality of wiring members for electrically conducting to an external portion from the internal space of a housing formed of the wiring board and the ribs, an imaging element fastened to the wiring board inside the internal space, a transparent plate fastened to an upper surface of the ribs, and connecting members which connect electrodes of the imaging element with the wiring members; the method comprising:

resin molding a lattice-shaped rib forming member, which is an aggregation of a plurality of frame-shaped ribs for configuring a plurality of solid-state imaging devices, with a cross sectional shape of the rib having a taper in a vertical direction;

using an aggregate wiring board, which has regions corresponding to a plurality of the wiring boards, and in which a plurality of the wiring members are provided in each of the regions;

fastening an imaging element to each region of the aggregate wiring board and connecting by the connecting members the electrodes of the imaging elements and the wiring members;

placing the rib forming member on the wiring board face and joining the rib forming member with the wiring board face, so that the imaging element is disposed inside the lattice elements of the rib forming member and the rib forming member is fastened to a wiring board face such that a narrow side of the ribs faces the wiring board;

fastening the transparent plate to an upper face of the rib forming member on a broader side of the rib; and cutting each housing in a direction perpendicular to the base portion, and in a direction dividing into two the width of the rib forming member, and separating the solid-state imaging devices into individual pieces.

2. The method for manufacturing a solid-state imaging device according to claim 1, wherein when fastening the transparent plate, the transparent plate of a size covering a plurality of housings is fastened to the top face of the rib forming member, and when cutting each housing, the transparent plate is also cut at the same time.

3. The method for manufacturing a solid-state imaging device according to claim 1, wherein, when fastening the transparent plate, a plurality of transparent plates corresponding to the individual housings are used, edges of adjacent transparent plates are mounted onto the rib forming member forming a gap between the edges, and the solid-state imaging devices are separated into pieces in a region of the gaps.

* * * * *